(12) United States Patent
Kengeri et al.

(10) Patent No.: US 8,208,329 B2
(45) Date of Patent: Jun. 26, 2012

(54) NO-DISTURB BIT LINE WRITE FOR IMPROVING SPEED OF EDRAM

(75) Inventors: Subramani Kengeri, San Jose, CA (US); Kuoyuan (Peter) Hsu, San Jose, CA (US); Bing Wang, Milpitas, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/094,389

(22) Filed: Apr. 26, 2011

(65) Prior Publication Data

US 2011/0199835 A1    Aug. 18, 2011

Related U.S. Application Data

(62) Division of application No. 12/055,095, filed on Mar. 25, 2008, now Pat. No. 7,952,946.

(60) Provisional application No. 60/991,639, filed on Nov. 30, 2007.

(51) Int. Cl.
*G11C 7/00* (2006.01)

(52) U.S. Cl. .................. 365/203; 365/189.16; 365/149; 365/210.13

(58) Field of Classification Search .................. 365/203, 365/189.16, 149, 210.13
See application file for complete search history.

(56) References Cited

U.S. PATENT DOCUMENTS

| 6,839,268 B2 | 1/2005 | Osada et al. |
| 2005/0174859 A1 | 8/2005 | Mori et al. |
| 2008/0117698 A1 | 5/2008 | Hsu |
| 2008/0298146 A1* | 12/2008 | Terzioglu .................. 365/200 |

* cited by examiner

*Primary Examiner* — Vu Le
*Assistant Examiner* — Han Yang
(74) *Attorney, Agent, or Firm* — Slater & Matsil, L.L.P.

(57) ABSTRACT

A method of operating a memory circuit includes providing the memory circuit. The memory circuit includes a memory cell; a word line connected to the memory cell; a first local bit line and a second local bit line connected to the memory cell; and a first global bit line and a second global bit line coupled to the first and the second local bit lines, respectively. The method further includes starting an equalization to equalize voltages on the first and the second local bit lines; stopping the equalization; and after the step of starting the equalization and before the step of stopping the equalization, writing values from the first and the second global bit lines to the first and the second local bit lines.

13 Claims, 3 Drawing Sheets

NO-DISTURB BIT LINE WRITE FOR IMPROVING SPEED OF EDRAM

This application is a divisional of U.S. patent application Ser. No. 12/055,095, entitled "No-Disturb Bit Line Write for Improving Speed of eDRAM," filed Mar. 25, 2008, which application further claims the benefit of the following commonly assigned U.S. Provisional Patent Application No. 60/991,639, filed Nov. 30, 2007, entitled "No-Disturb Bit Line Write for Improving Speed of eDRAM," which patent applications are incorporated herein by reference.

TECHNICAL FIELD

This invention relates generally to dynamic random access memories (DRAM), and more particularly to improving the write speed of embedded DRAMs (eDRAM).

BACKGROUND

Embedded dynamic random access memories (eDRAM) are widely used for their improved performances in high-speed applications, such as computing units (CPU).

In eDRAM circuits, local bit lines are connected to eDRAM cells and global bit lines, which are further connected to control circuits. Through the global bit lines and the connecting local bit lines, write operations may be performed to write to the eDRAM cells. The local bit lines typically include two lines with often-inversed phases, namely BL and BLB. The global bit lines also include two lines with often-inversed phases, namely GBL and GBLB.

Conventionally, before a write operation of an eDRAM cell, equalization is performed to short the local bit lines BL and BLB. After the equalization and local bit lines BL and BLB pre-charge are finished, and the write select enable signal WSSL is turned on, the values pre-charged on the global bit lines GBL and GBLB are written to the local bit lines BL and BLB. The word line connected to the eDRAM cell is then turned on to write the values on the local bit lines into the capacitor in the eDRAM cell.

FIG. 1 illustrates waveforms obtained from a conventional eDRAM circuit, wherein a "1" is to be written into an eDRAM cell storing a "0." Line 20 indicates the voltage on the word line connected to the eDRAM cell. The falling edge 22 indicates turning on the word line. Line 24 is the voltage on a write select enable line, which voltage controls writing the local bit lines BL and BLB from global bit lines GBL and GBLB. The rising edge 26 of line 24 indicates turning on the writing. Lines 28 and 30 represent voltages on local bit lines BL and BLB, respectfully. It is noted after the rising edge 26 of line 24 occurs, bit line voltage 28 turns downward first before it flips and rises (refer to the voltage inside dotted circle 32). Extra time is thus needed for this flip action. This is partially because the writing of values from global bit lines to local bit lines occurs after turning on the sense amplifier (at time t'). At this time, the voltage on bit line BL is still lower than the voltage on bit line BLB. The voltages on the bit lines BL and BLB are thus amplified in the wrong direction first, before they are amplified in the right direction, which bit line BL has a higher voltage than bit line BLB. Actually, during this period, the voltage stored in the memory cell drops before it rises.

The extra voltage flip results in two adverse effects. First, the time needed for local bit lines BL and BLB to be fully charged is lengthened. This adversely affects the speed for write operations. As matter of fact, write operations typically take more recovery time (write recovery) than read operations (read recovery), and thus are the bottlenecks of eDRAM memories. Second, the local bit lines BL and BLB, without enough time and/or margin to be fully charged, will cause the reduction in the voltages written into the memory cells. It is often found that the initial voltages in eDRAM memory cells are lower than after read operations, which cause the rewriting of the memory cells. New methods are thus needed to solve the above-discussed problems.

SUMMARY OF THE INVENTION

In accordance with one aspect of the present invention, a method of operating a memory circuit includes providing the memory circuit. The memory circuit includes a memory cell; a word line connected to the memory cell; a first local bit line and a second local bit line connected to the memory cell; and a first global bit line and a second global bit line coupled to the first and the second local bit lines, respectively. The method further includes starting an equalization to equalize voltages on the first and the second local bit lines; stopping the equalization; and after the step of starting the equalization and before the step of stopping the equalization, writing values from the first and the second global bit lines to the first and the second local bit lines.

In accordance with another aspect of the present invention, a method of operating a memory circuit includes providing the memory circuit including a memory cell; a word line connected to the memory cell; a first local bit line and a second local bit line connected to the memory cell; and a first global bit line and a second global bit line coupled to the first and the second local bit lines, respectively. The method further includes writing values from the first and the second global bit lines to the first and the second local bit lines; and enabling the word line after the step of writing values begins.

In accordance with yet another aspect of the present invention, a method of operating a memory circuit includes providing the memory circuit including a memory cell; a first local bit line and a second local bit line connected to the memory cell; a first global bit line and a second global bit line; a multiplexer (MUX) coupled between the first and the second local bit lines and the first and the second global bit lines; and a sense amplifier connected to the first and the second local bit lines. The method further includes starting an equalization to equalize voltages on the first and the second local bit lines; stopping the equalization; after the step of starting the equalization and before the step of stopping the equalization, activating the MUX to write values from the first and the second global bit lines to the first and the second local bit lines; enabling the word line after the step of stopping the equalization; deactivating the MUX at a time after the step of stopping the equalization and before the step of enabling the word line; and after the step of stopping the equalization, enabling the sense amplifier.

In accordance with yet another aspect of the present invention, a memory circuit includes a memory cell; a word line connected to the memory cell; local bit lines connected to the memory cell, wherein the local bit lines comprise a first local bit line and a second local bit line; global bit lines comprising a first global bit line and a second global bit line; a MUX coupled between the local bit lines and the global bit lines, the MUX being configured to connect the local bit lines and the global bit lines when activated, and disconnect the local bit lines and the global bit lines when deactivated; an equalization circuit coupled between the first and the second local bit lines, the equalization circuit being configured to equalize voltages on the first and the second local bit lines; and a signal generator. The signal generator is configured to generate a sequence of signals including a MUX activation signal for activating the MUX; an equalization enable signal for enabling the equalization circuit; and an equalization disable signal for disabling the equalization circuit, wherein the MUX activation signal is later in time than the equalization enable signal, and earlier in time than the equalization disable signal.

In accordance with yet another aspect of the present invention, a memory circuit includes a memory cell; local bit lines connected to the memory cell, wherein the local bit lines comprise a first local bit line and a second local bit line; global bit lines comprising a first global bit line and a second global bit line; a sense amplifier connected to the first and the second local bit lines; a MUX coupled between the local bit lines and the global bit lines, the MUX being configured to connect the local bit lines and the global bit lines when activated, and disconnect the local bit lines and the global bit lines when deactivated; an equalization circuit coupled between the first and the second local bit lines, the equalization circuit being configured to equalize voltages on the first and the second local bit lines; and a signal generator. The signal generator is configured to generate a sequence of signals including a MUX activation signal for activating the MUX; an equalization enable signal for enabling the equalization circuit; an equalization disable signal for disabling the equalization circuit, wherein the MUX activation signal is later in time than the equalization enable signal, and earlier in time than the equalization disable signal; a word line enable signal for enabling the word line, wherein the word line enable signal is later in time than the equalization disable signal; a MUX deactivation signal later in time than the equalization disable signal and earlier in time than the word line enable signal; and a sense amplifier enabling signal later in time than the equalization disable signal.

The advantageous features of the embodiments of the present invention include increased speed in write operations and improved reliability due to the increase in the voltage of eDRAM cells in the initial write operations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments of the present invention are discussed hereinafter by referring to embedded dynamic random access memories (eDRAM), partially for the reason that eDRAMs are often operated at very high frequencies, and thus they need to have very high write and read speeds. However, the teaching provided by the embodiments of the present invention may be readily used for other types of DRAMs.

Figure 1:
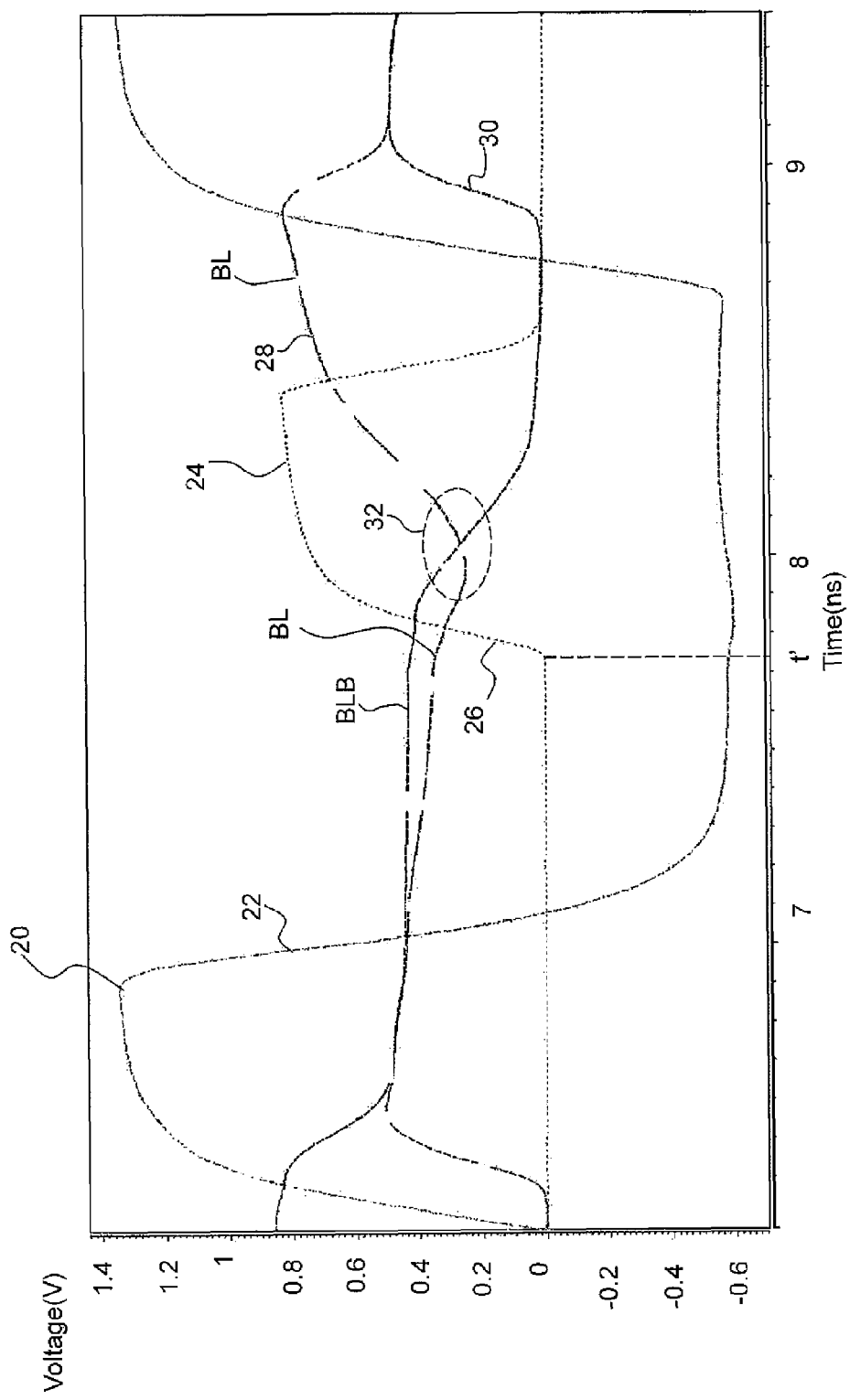
FIG. 1 illustrates waveforms obtained from a write operation in a conventional memory circuit.
Figure 2:
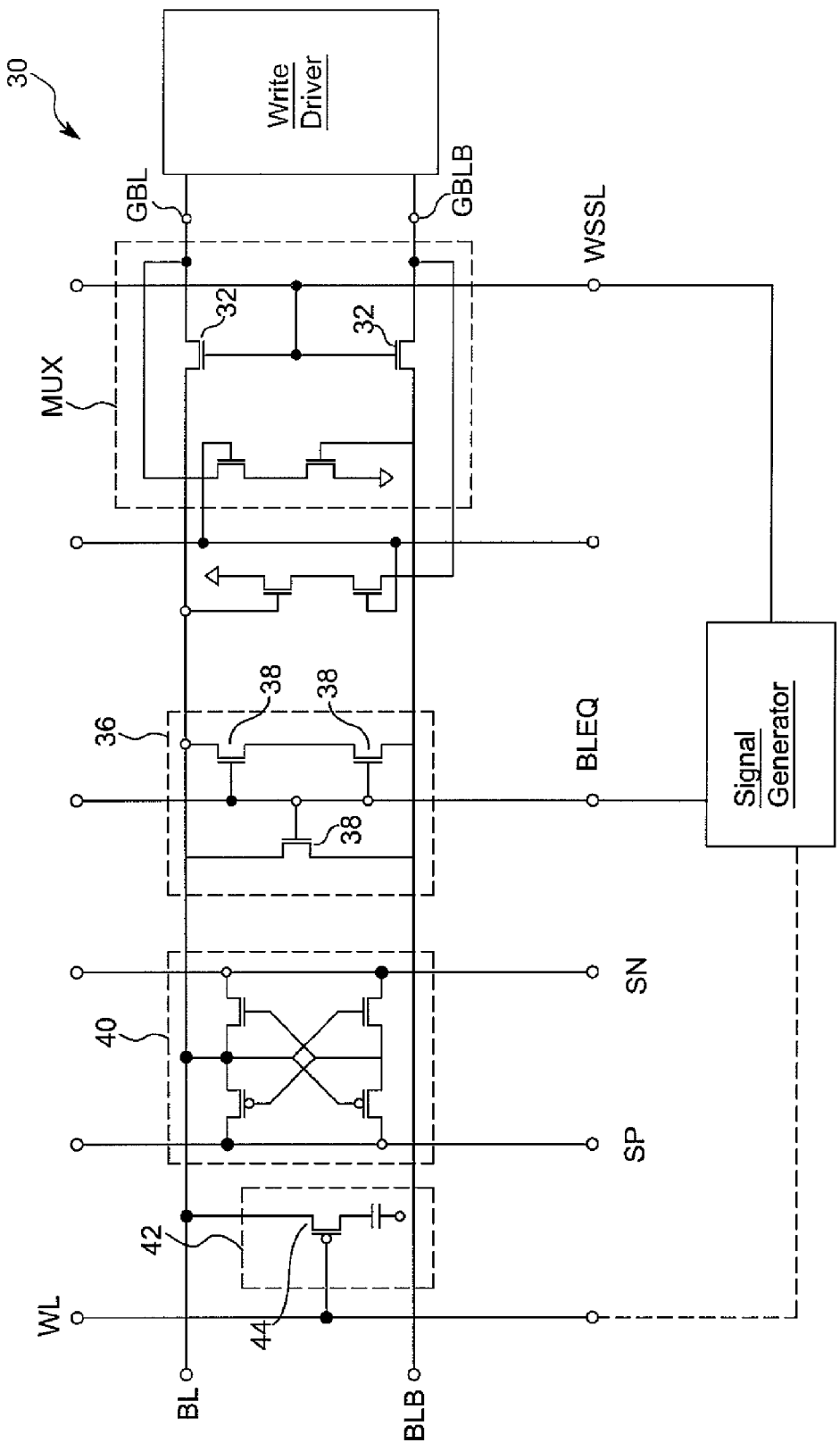
FIG. 2 illustrates a schematic circuit diagram of an embodiment of the present invention.

FIG. 2 illustrates a circuit diagram of an exemplary circuit, which includes a part of an eDRAM memory 30. In this embodiment, only a pair of local bit lines BL and BLB (also referred to as BL bar), and a pair of global bit lines GBL and GBLB (also referred to as GBL bar) are shown, wherein local bit lines BL and BLB are complementary to each other, and global bit lines GBL and GBLB are complementary to each other. One skilled in the art will realize that a memory typically includes a plurality of local bit lines and a plurality of global bit lines. Global bit lines GBL and GBLB are connected to a write driver for proving write currents and for setting voltages on global bit lines GBL and GBLB.

A multiplexer (MUX) is coupled between, and used to connect or disconnect local bit lines BL and BLB to respective global bit lines GBL and GBLB. In an exemplary embodiment, the MUX includes a pair of pass-gate transistors 32, and is controlled by the voltage on a (bit line) write select enable line WSSL. When the voltage on write select enable line WSSL is high, the MUX connects local bit lines BL and BLB to the respective global bit lines GBL and GBLB, so that the values on global bit lines GBL and GBLB may be written into local bit lines BL and BLB.

eDRAM cell 42, which includes a transistor and a capacitor, is illustrated to symbolize the memory cells in memory 30. It is realized, however, that an eDRAM cell may have a different structure, or be connected differently, than eDRAM cell 42. Preferably, memory 30 includes array(s) of memory cells, preferably arranged in a plurality of rows and a plurality of columns. The transistor 44 in memory cell 42 may have, for example, a source connected to one of the local bit lines, such as BLB. The gate of transistor 44 is connected to word line WL.

Equalization circuit 36 is connected between, and is used to perform equalization on, local bit lines BL and BLB. During the equalization, bit line equalization line BLEQ is turned on (with a high voltage), which in turn turns on transistors 38, and hence local bit lines BL and BLB are interconnected. The connection of local bit lines BL and BLB is referred to as equalization since the voltages on them are equalized.

Sense amplifier 40 is coupled between the local bit lines BL and BLB, and between sense amplifier select lines SP and SN. When a high voltage is applied on sense amplifier select line SP, and a low voltage is applied on sense amplifier select line SN, sense amplifier 40 is activated to amplify the voltages on local bit lines BL and BLB.

In the embodiments of the present invention, the timing of the voltages on the signal lines are tightly coupled, as will be discussed in detail in subsequent paragraphs. A signal generator is thus used to generate the signals and to coordinate the timing of the signals. In an embodiment of the present invention, the signal generator is coupled to write select enable line WSSL, bit line equalization line BLEQ, and word line WL. One skilled in the art, with the teaching of the present invention, will be able to realize the implementation of the signal generator. In an exemplary embodiment, the signal generator may take voltages on bit line equalization line BLEQ and write enable signals WE (not shown) as inputs to generate the signal on WSSL (also referred to as MUX activation/deactivation signals). This way, the existing circuits for generating the signals for word line and the bit line equalization line may be used. In another exemplary embodiment, the signal generator may generate all of the voltages/signals on bit line equalization line BLEQ, sense amplifier select lines SP and SN, write select enable line WSSL, word line WL, and the like.

Figure 3:
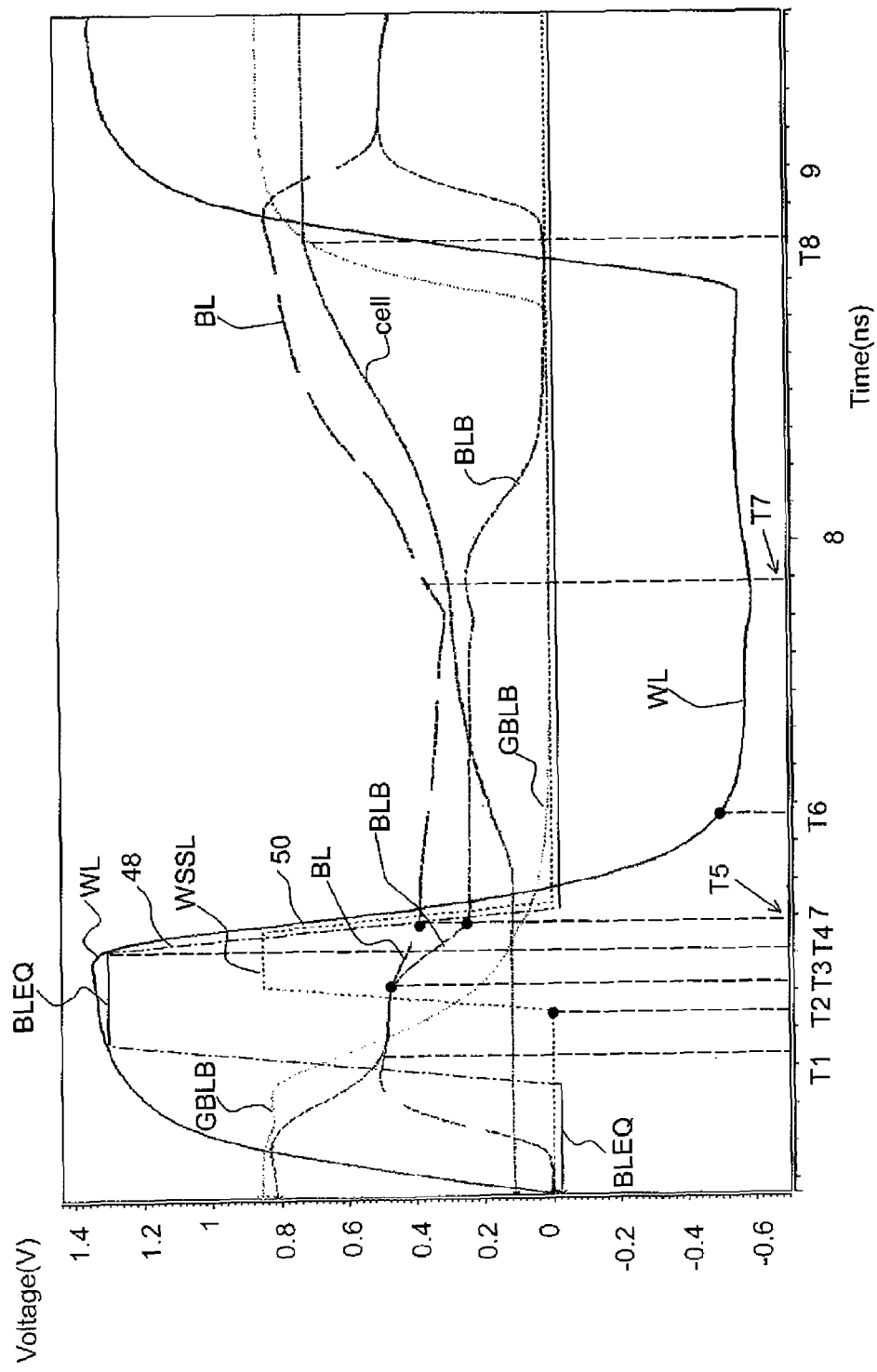
FIG. 3 illustrates waveforms obtained from a write operation in an embodiment of the present invention.

FIG. 3 illustrates waveforms for an exemplary write operation to memory cell 42 (refer to FIG. 2), wherein the voltages are shown as functions of time. For a clear view, the voltage on a line or a node is marked using the same name as the respective line or node. For example, the voltage on word line WL is indicated as WL, and the voltage on write select enable line WSSL is indicated as WSSL. In the illustrated embodiment, memory cell 42 stores a "0" before the write operation, and will be written into with a "1." Accordingly, the global bit lines GBL (not shown) and GBLB are pre-charged to have a high voltage and a low voltage (for example, at ground level), respectively. Similarly, the local bit lines BL and BLB should be written by the global bit lines GBL and GBLB to have a high voltage and a low voltage (for example, the ground voltage), respectively. In other words, to write the "1" into memory cell 42, local bit line BL needs to have a higher voltage than local bit line BLB, and such a voltage combination is referred to as being in the "right" direction hereinafter.

In the embodiments of the present invention, the local bit lines BL and BLB are pre-written in order to increase the speed of write operations. Conventionally, the writing of local bit lines is performed at the same time, or after, the respective word lines are enabled. In the preferred embodiment of the present invention, the pre-writing of the bit lines BL and BLB starts at the time the equalization is still being performed. Referring to FIG. 3, at time T1, the equalization is started, wherein the bit line equalization voltage BLEQ (refer to FIG. 2) starts to rise, and hence local bit lines BL and BLB are shorted. This causes the voltages BL and BLB to merge in FIG. 3. At time T2, which is after (later in time than) time T1, the voltage on write select enable line WSSL starts to rise, and the MUX (refer to FIG. 2) will connect global bit lines GBL and GBLB to local bit lines BL and BLB, respectively. At this time, global bit lines GBL and GBLB are still being pre-charged by the write driver.

The write driver (refer to FIG. 2) provides currents to charge global bit lines GBL and GBLB, which in turn charge local bit lines BL and BLB. Accordingly, the write driver tries to write desirable voltages to local bit lines BL and BLB, that is, to lower the voltage on local bit line BLB to ground, and to increase the voltage on local bit line BL to operation voltage VDD. The equalization circuit 36 (also refer to FIG. 2), on the other hand, tries to equalize the voltages on local bit lines BL and BLB. The write driver and the equalization circuit 36 thus are in a competition. Preferably, the write driver is stronger than the equalization circuit 36, and hence the net effect is to cause a voltage split between local bit lines BL and BLB, which voltage split starts to appear at time T3, and increases with time. The term "stronger" indicates that the write driver provides a greater current than an equalization current generated by the equalization circuit. Although the voltage split is not equal to VDD, it is in the "right" direction, that is, the voltage on local bit line BL is higher than the voltage on local bit line BLB. A significance of the voltage split is that it will be picked up by sense amplifier 40 (refer to FIG. 2), after sense amplifier 40 is turned on, to amplify the bit line signals. Accordingly, sense amplifier 40 may be turned on earlier without the concern that it might amplify the wrong local bit line signals. Accordingly, the write operation may be expedited. Also, with the voltages on the local bit lines in the "right" direction, the value (refer to the line marked as "cell" in FIG. 3) stored in the memory cell starts to be written in the right direction as soon as sense amplifier 40 is turned on.

Another advantageous feature of turning on write select enable line WSSL during the equalization stage is that writing into local bit lines BL and BLB at this time will not cause the neighboring local bit lines to be adversely affected by cross-talk. This is because when the local bit lines are written into, the neighboring local bit lines are still in the equalization stage, and hence are substantially immune to the cross-talk.

At time T4, which is later in time than time T3, the equalization circuit 36 (FIG. 2) starts to be turned off, so that local bit lines BL and BLB are disconnected. At time T5, the write select enable line WSSL starts to be turned off, which causes the global bit lines GBL and GBLB to be disconnected from local bit lines BL and BLB. The voltage split between local bit lines BL and BLB thus stops increasing. In an embodiment, time T4 equals time T5. In other embodiments, time T5 is after time T4, meaning the equalization circuit 36 needs to be turned off before the MUX is deactivated. Accordingly, the falling edge 48 of bit line equalization voltage BLEQ occurs before the falling edge of word line voltage WL, wherein the falling edge 50 of WL indicates the word line WL is being turned on.

At time T6, the word line WL is fully turned on, and the values on local bit lines BL and BLB are written (or transferred) into memory cell 42. At time T7, sense amplifier 40 (refer to FIG. 2) is turned on, and the values on local bit lines BL and BLB are amplified to VDD and ground voltage, respectfully. Eventually, at time T8, the word line WL is fully turned off, and the write operation is concluded.

The embodiments of the present invention have several advantageous features. First, with the local bit lines pre-written to the right direction, the write speed can be increased to substantially the same as the read speed. Therefore, write operations are no longer the bottleneck of the memories. Second, the memory cells can be written to higher voltages in the initial write operations. Experiments have revealed that the voltage in memory cells were written to about 710 mV by using the embodiments of the present invention, while using convention schemes, the voltage in memory cells are only about 659 mV, if the conventional memory circuit and the embodiments of the present invention have the same write speed. The increase in the initial write voltage in memory cells advantageously improves the reliability of the memory cells.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory circuit comprising:
a memory cell;
a word line connected to the memory cell;
local bit lines connected to the memory cell, wherein the local bit lines comprise a first local bit line and a second local bit line;
global bit lines comprising a first global bit line and a second global bit line;

a multiplexer (MUX) coupled between the local bit lines and the global bit lines, the MUX being configured to connect the local bit lines and the global bit lines when activated, and disconnect the local bit lines and the global bit lines when deactivated;

an equalization circuit coupled between the first and the second local bit lines, the equalization circuit being configured to equalize voltages on the first and the second local bit lines; and a signal generator configured to generate a sequence of signals comprising:
- a MUX activation signal for activating the MUX;
- an equalization enable signal for enabling the equalization circuit; and
- an equalization disable signal for disabling the equalization circuit, wherein the MUX activation signal is later in time than the equalization enable signal, and earlier in time than the equalization disable signal.

2. The memory circuit of claim 1 further comprising a write driver connected to the global bit lines.

3. The memory circuit of claim 2, wherein the write driver is stronger than the equalization circuit.

4. The memory circuit of claim 1, wherein the signal generator is further configured to generate a word line enable signal, and wherein the word line enable signal is later in time than the MUX activation signal.

5. The memory circuit of claim 4, wherein the equalization disable signal is earlier in time than the word line enable signal.

6. The memory circuit of claim 4 further comprising a sense amplifier connected to the first and the second bit lines and configured to amplify signals on the first and the second bit lines, wherein the signal generator is further configured to generate a sense amplifier enable signal.

7. The memory circuit of claim 4, wherein the signal generator is further configured to generate a MUX deactivation signal, wherein the MUX deactivation signal is later in time than the equalization disable signal and earlier in time than the word line enable signal.

8. The memory circuit of claim 1, wherein the memory cell is a dynamic random access memory (DRAM) cell.

9. A memory circuit comprising:
a memory cell;
local bit lines connected to the memory cell, wherein the local bit lines comprise a first local bit line and a second local bit line;
global bit lines comprising a first global bit line and a second global bit line;
a sense amplifier connected to the first and the second local bit lines;
a multiplexer (MUX) coupled between the local bit lines and the global bit lines, the MUX is configured to connect the local bit lines and the global bit lines when activated, and disconnect the local bit lines and the global bit lines when deactivated;
an equalization circuit coupled between the first and the second local bit lines, the equalization circuit being configured to equalize voltages on the first and the second local bit lines; and
a signal generator configured to generate a sequence of signals comprising:
- a MUX activation signal for activating the MUX;
- an equalization enable signal for enabling the equalization circuit;
- an equalization disable signal for disabling the equalization circuit, wherein the MUX activation signal is later in time than the equalization enable signal, and earlier in time than the equalization disable signal;
- a word line enable signal for enabling the word line, wherein the word line enable signal is later in time than the equalization disable signal;
- a MUX deactivation signal later in time than the equalization disable signal and earlier in time than the word line enable signal; and
- a sense amplifier enabling signal later in time than the equalization disable signal.

10. The memory circuit of claim 9, wherein the sense amplifier enable signal is later in time than the word line enable signal.

11. The memory circuit of claim 9 further comprising a write driver connected to the first and the second global bit lines, wherein the write driver provides a current greater than an equalization current generated by the equalization circuit.

12. The memory circuit of claim 9, wherein the MUX comprises a pair of pass-gate transistors.

13. The memory circuit of claim 9, wherein the memory cell is an embedded dynamic random access memory (eDRAM) cell.

* * * * *